United States Patent [19]

Henderson et al.

[11] 4,370,628
[45] Jan. 25, 1983

[54] RELAXATION OSCILLATOR INCLUDING CONSTANT CURRENT SOURCE AND LATCH CIRCUIT

[75] Inventors: Alva Henderson; Douglas B. Hoy, both of Lubbock, Tex.

[73] Assignee: Texas Instruments Incorporated, Dallas, Tex.

[21] Appl. No.: 207,312

[22] Filed: Nov. 17, 1980

[51] Int. Cl.³ .......................................... H03K 3/282
[52] U.S. Cl. ............................. 331/111; 331/113 R; 331/DIG. 3
[58] Field of Search ............... 331/111, 113 R, 108 C, 331/108 D, DIG. 3

[56] References Cited

U.S. PATENT DOCUMENTS

| | | | |
|---|---|---|---|
| 3,702,446 | 11/1972 | Steudel | 331/111 |
| 4,083,020 | 4/1978 | Goldberg | 331/113 R |
| 4,292,605 | 9/1981 | Rodgers | 331/111 |

Primary Examiner—Siegfried H. Grimm
Attorney, Agent, or Firm—Leo N. Heiting; Robert D. Marshall; Melvin S. Sharp

[57] ABSTRACT

An oscillator circuit which demonstrates stable operation over a wide range of supply voltages and process variations. A latch circuit is controlled utilizing a timing capacitor. A constant current source is applied alternately to opposite sides of the timing capacitor through a series of switching gates which bootstrap the voltage across the timing capacitor, with the switching gates being controlled by the output of the latch circuit.

2 Claims, 4 Drawing Figures

RELAXATION OSCILLATOR INCLUDING CONSTANT CURRENT SOURCE AND LATCH CIRCUIT

BACKGROUND OF THE INVENTION

This invention relates to oscillator circuits, and more specifically to oscillator circuits suitable for use in integrated circuits.

Oscillator circuits find many applications, particularly in the areas of timing circuits and clock signal generators. It is well known in the art to utilize an oscillator as a clock signal generator, and to set the frequency to be generated by use of a timing capacitor. The time constant of capacitor charge or discharge can be conveniently calculated and provides a basis for approximating the desired frequency in a clock circuit. Examples of the utilization of a timing capacitor in an oscillator circuit may be seen in U.S. Pat. No. 3,934,233, (FIG. 6Q) and on pages 285-287 of "The Linear Control Circuits Data book for Design Engineers," Second Edition, Texas Instruments Incorporated, Dallas, Texas. Typically, prior art circuits utilized the supply voltages to charge and discharge the timing capacitor.

SUMMARY OF THE INVENTION

One aspect of the invention is embodied in an oscillator circuit which utilizes a timing capacitor and additional circuitry which provides compensation for variations in voltage supply and process parameters. Stable operation despite variations in voltage and process is a highly desired aspect of an oscillator circuit which is utilized for timing purposes.

It is, therefore, one object of this invention to provide an oscillator circuit which is easily implementable in integrated circuit technology.

It is another object of this invention to provide an oscillator circuit which is stable over a wide range of supply voltages.

It is is yet another object of this invention to provide an oscillator circuit which is stable over a wide range of process variations.

The foregoing objects are achieved as is now described. A set-reset latch circuit is provided with a timing capacitor across the input. A constant current source is applied to the timing capacitor through a series of switching circuits which bootstrap the voltage across the timing capacitor. This circuit arrangement provides compensation for process and voltage variations.

BRIEF DESCRIPTION OF THE DRAWINGS

The novel features believed characteristic of the invention are set forth in the appended claims. The invention itself, however, as well as a preferred mode of use, further objects and advantages thereof, will best be undestood by reference to the following detailed description of an illustrative embodiment when read in conjunction with the accompanying drawings, wherein;

DETAILED DESCRIPTION

Figure 1:
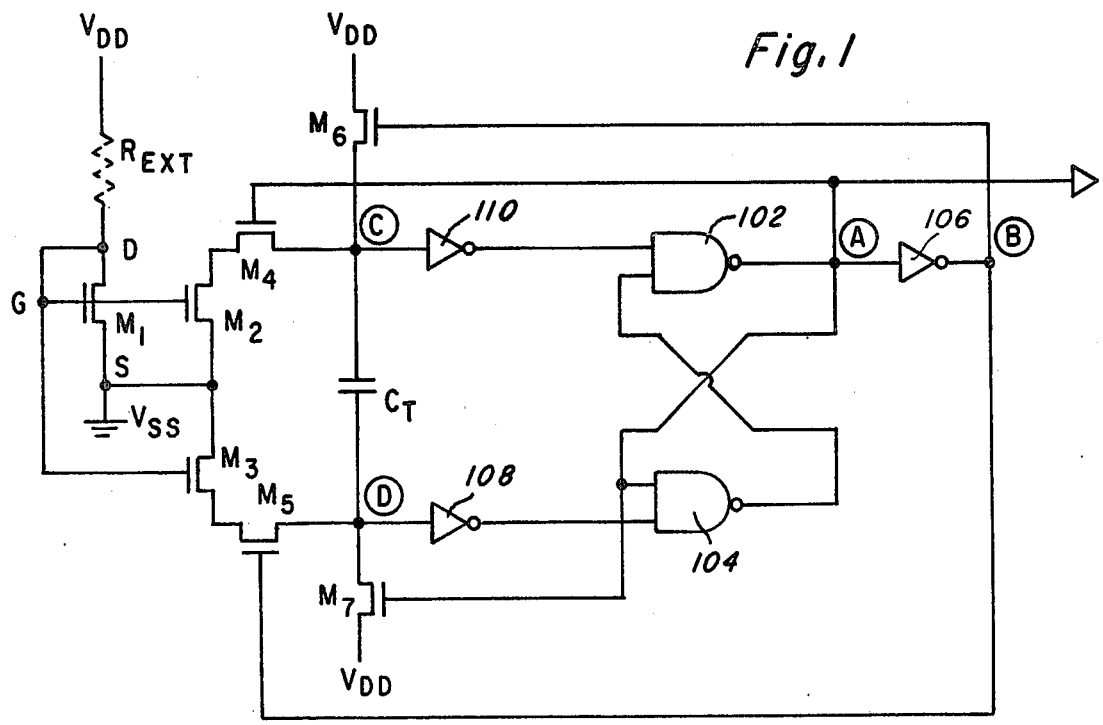
FIG. 1 is a circuit diagram of one embodiment of a self compensating oscillator circuit of the invention.

Referring now to FIG. 1, there is shown a circuit diagram of one embodiment of an oscillator circuit which embodies the present invention. While the circuit shown is embodied in a metal-insulator-semiconductor technology, it will of course be appreciated by those skilled in the art that the advantages taught in this invention will find application in bipolar circuitry and in discrete component circuits as well as integrated circuit processes.

The oscillator depicted in FIG. 1 is a relaxation type oscillator formed by a pair of cross coupled NAND gates, 102 and 104. Cross coupled NAND gates 102 and 104 form a set-reset, flip-flop circuit which permits high loop gain. The output of NAND gates 102 and 104 is seen at point A in FIG. 1 and inverter 106 is utilized to invert the signal at point A and thus ensure oscillation.

Transistor $M_1$ is utilized as a constant current source, the amount of current being selectable, in a preferred embodiment, by the selection of $R_{EXT}$. The drain of transistor $M_1$ is connected to the gate of transistor $M_1$ and the gates of transistors $M_2$ and $M_3$. This connection, and the selection of an external fixed load, causes the drain current of transistors $M_1$, $M_2$ and $M_3$ to vary approximately linearly with shifts in threshold voltage ($V_{TX}$), a major process effect on oscillator stability. The connection of the gate of transistor $M_1$ to the gates of transistors $M_2$ and $M_3$, causes transistors $M_2$ and $M_3$ to act as current "mirrors". That is, the drain current of transistors $M_2$ and $M_3$ is linearly proportional to that of transistor $M_1$. Those skilled in the art will appreciate that the constant of proportionality is a function of the geometry of the subject transistors.

Figure 2:
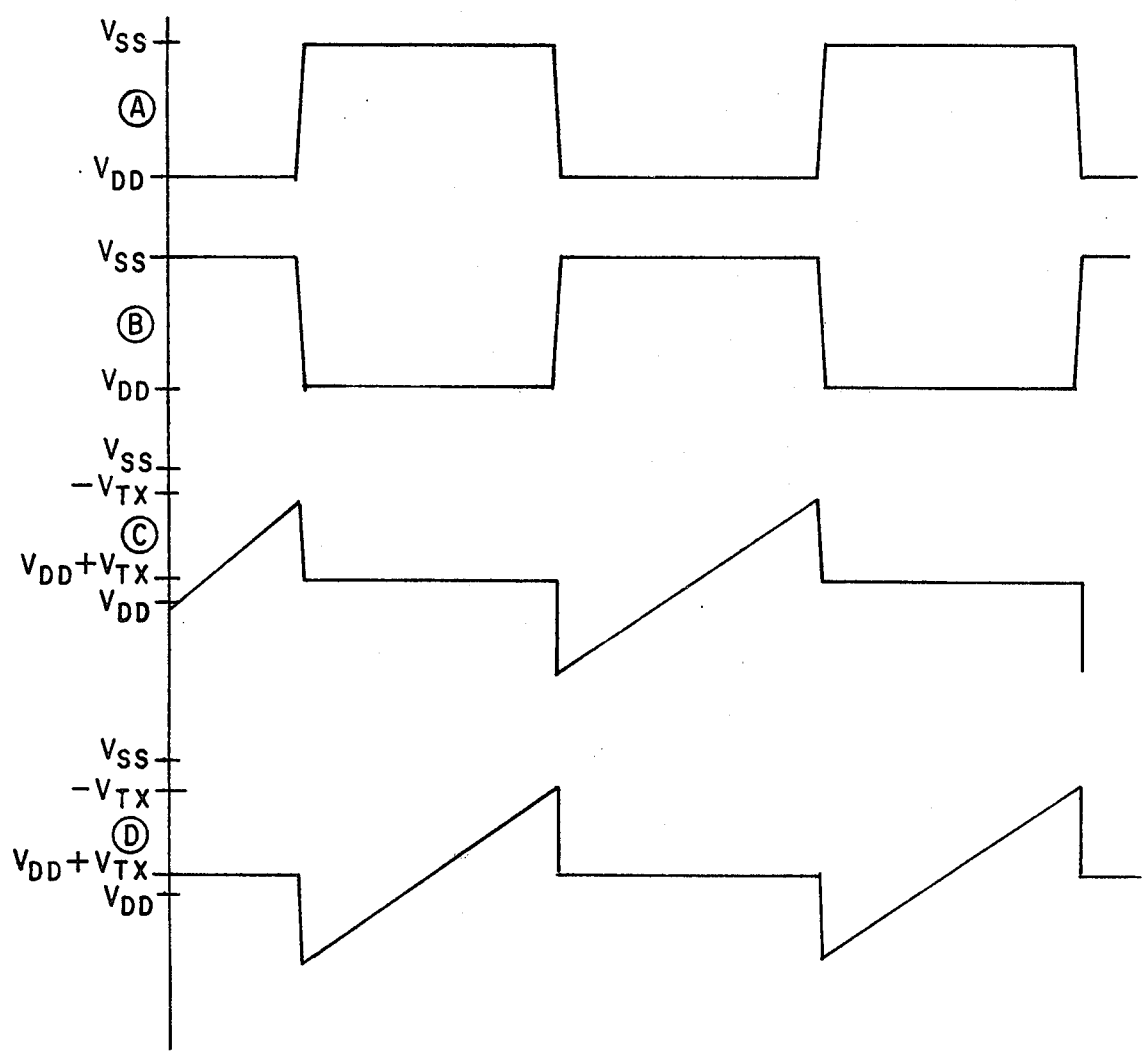
FIG. 2 is a series of voltage waveforms characteristic of normal operation of the oscillator circuit of FIG. 1.

The operation of the compensation network and the oscillator circuit will now be described with respect to the circuit disclosed in FIG. 1 and the voltage waveforms depicted in FIG. 2. It should be noted that the waveforms of FIG. 2 assume a circuit implemented in P-channel metal-insulator-semiconductor. Further, the most negative voltage ($V_{DD}$), is considered a logic "zero" and turns a P-channel device on.

Initially, point A is considered to be a logic "zero" ($V_{DD}$), and point B is a logic "one". Thus, transistors $M_4$ and $M_7$ are conducting and transistors $M_5$ and $M_6$ are not. Timing capacitor $C_T$ is connected between points C and D and is coupled to $V_{DD}$ through transistor $M_7$ at point D and to the constant current source through transistor $M_4$. Since timing capacitor $C_T$ is being charged by a constant current source, the voltage waveform across $C_T$ is a linear waveform (rather than exponential). This linear voltage increases toward $V_{SS}$, approaching the threshold voltage ($V_{TX}$). $V_{TX}$ is typically approximately one volt in P-channel metal-insulator-semiconductor technology; however, $V_{TX}$ may vary as much as four-tenths of a volt with process variations. It is precisely this variation that is a major factor in oscillator stability. As timing capacitor $C_T$ approaches the threshold voltage, the latch formed by gates 102 and 104 changes state. Point A becomes a logic "one" and Point B becomes a logic "zero", turning on transistors $M_5$ and $M_6$ and turning off transistors $M_4$ and $M_7$. Transistor $M_6$ couples $V_{DD}$ to point C and thus "bootstraps" a voltage at point D in order to maintain the voltage differential across timing capacitor $C_T$. Those skilled in the art will appreciate that this "bootstrap" effect occurs to prevent an instantaneous change in voltage across timing capacitor $C_T$, and that the voltage at point D then approaches approximately twice $V_{DD}$. Transistor $M_5$ couples the constant current source to timing capacitor $C_T$ and charges timing capacitor $C_T$ linearly toward $V_{TX}$. This artifically increased voltage level necessitates a much longer charging period and thus descreases the oscillator response to a variation in threshold voltage. When Point D reaches threshold voltage $V_{TX}$, the latch formed by gates 102 and 104 again changes state and the process is repeated.

Figure 3A:
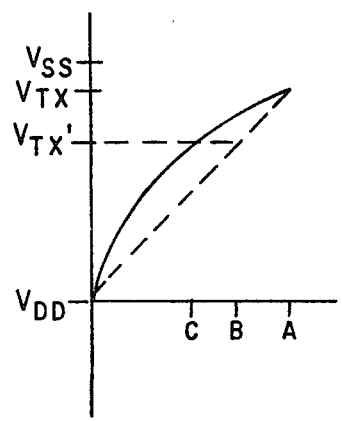
FIGS. 3a and 3b are voltage waveforms charateristic of certain of the compensating effects of the self compensating oscillator circuit of FIG. 1.
Figure 3B:
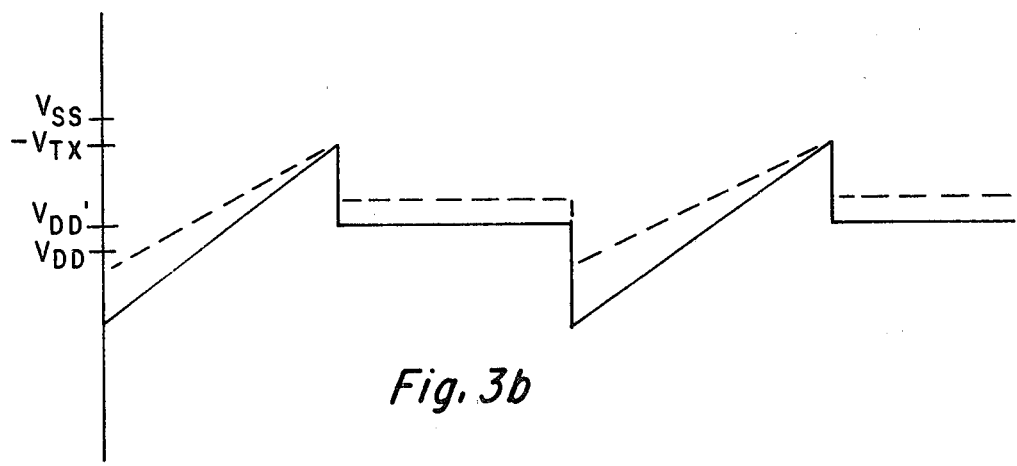

For an increased understanding of certain of the compensation factors found in the present invention, refer to FIG. 3a and FIG. 3b. In FIG. 3a a comparison of the linear charging waveform of the present invention, and the typical exponential waveform seen in previously known circuitry. A transition occurring at a particular threshold voltage, $V_{TX}$, can be seen to result in an oscillator period proportional to point A of FIG. 3a. A change in threshold voltage to $V_{TX}'$, will result in an oscillator period proportional to point B. It can readily be seen that an exponential charging curve will result in a more substantial variation in oscillator period (to point C in FIG. 3a), thus demonstrating the increased stability resulting from the use of a constant current source as a charging mechanism for timing capacitor $C_T$.

In FIG. 3b is depicted the compensatory effects of the present invention with regard to variations in voltage supply. Typically a decrease in voltage supply results in a corresponding decrease in loop gains and an increase in loop delay. Thus, a decrease in voltage supply will result in an increase in period and a decrease in oscillator frequency. In the present invention, as supply voltage decreases, for a given $R_{EXT}$, the current generated by the constant current source will also decrease. This decrease in charging current will have the effect of flattening out the charging waveform across timing capacitor $C_T$, and without any compensating effects would increase the period of the oscillator, as demonstrated in the prior art. However, the decrease in supply voltage also provides a decrease in the voltage through which timing capacitor $C_T$ must charge, as seen by the dashed line waveform in FIG. 3b. This descreased voltage swing compensates for the decrease in charging current and insulates the oscillator from the typical effects of decreased supply voltage. These two graphic illustrations depict certain of the compensating effects found in the oscillator circuit of the present invention. Laboratory testing of oscillator circuitry such as that described herein has revealed that wide variations of supply voltage and process parameters result in less than ten percent variation in oscillator output.

ALTERNATIVE EMBODIMENTS

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modification or embodiments that fall within the true scope of the invention.

What is claimed is:

1. A self compensating oscillator circuit comprising:
   a cross-coupled, set-reset latch circuit, having first and second input terminals and an output terminal;
   means connected to the output terminal for providing an inverted output;
   a timing capacitor connected across the input terminals;
   first, second, and third field-effect transistors, the drain of the first transistor being connected in common with the gates of the first, second, and third transistors;
   a first voltage source connected to the drain of the first transistor;
   a second voltage source connected to the sources of the first, second and third transistors;
   a fourth field-effect transistor connecting the drain of the second transistor to the first input terminal of the latch circuit, the gate of the fourth transistor being connected to the latch output;
   a fifth field-effect transistor connecting the drain of the third transistor to the second input terminal of the latch circuit, the gate of the fifth transistor being connected to the inverted latch output;
   a third voltage source;
   a sixth field-effect transistor connecting the first input terminal to the third voltage source, the gate of the sixth transistor being connected to the inverted latch output; and
   a seventh field-effect transistor connecting the second input terminal to the third voltage source, the gate of the seventh transistor being connected to the latch output.

2. The circuit of claim 1 wherein the latch circuit comprises first and second NAND gates and first and second inverters, each NAND gate having first and second inputs and an output, the output of the first NAND gate being the latch output, the output of the second NAND gate being connected to the first input of the first NAND gate, the output of the first NAND gate being connected to the first input of the second NAND gate, the first inverter connecting the first input terminal to the second input of the first NAND gate, the second inverter connecting the second input terminal to the second input of the second NAND gate.

* * * * *